(12) United States Patent
Hernandez et al.

(10) Patent No.: US 11,503,404 B1
(45) Date of Patent: Nov. 15, 2022

(54) SPEAKER ENHANCEMENT AND LINEARIZATION USING BEMF FEEDBACK

(71) Applicant: TEXAS INSTRUMENTS INCORPORATED, Dallas, TX (US)

(72) Inventors: David Hernandez, Fort Worth, TX (US); Supriyo Palit, Kolkata (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/362,650

(22) Filed: Jun. 29, 2021

(51) Int. Cl.
*H04R 3/00* (2006.01)
*H03F 3/183* (2006.01)

(52) U.S. Cl.
CPC ............... *H04R 3/00* (2013.01); *H03F 3/183* (2013.01); *H03F 2200/03* (2013.01)

(58) Field of Classification Search
None
See application file for complete search history.

(56) References Cited

U.S. PATENT DOCUMENTS

| 2009/0003628 | A1* | 1/2009 | Kirn | H04R 3/007 381/121 |
| 2019/0182589 | A1* | 6/2019 | Palit | H04R 29/003 |
| 2020/0186921 | A1* | 6/2020 | Palit | H03G 7/002 |

* cited by examiner

*Primary Examiner* — Qin Zhu
(74) *Attorney, Agent, or Firm* — Mark A. Valetti; Charles A. Brill; Frank D. Cimino

(57) ABSTRACT

A system includes a feedforward path coupled to a signal input. The system also includes a speaker coupled to the feedforward path. The system includes a back electromotive force (BEMF) extractor coupled to the speaker, where the BEMF extractor has a first input, a second input, and an output. The BEMF extractor includes a first summing point coupled to the first input. The BEMF extractor includes a resistor amplifier coupled to the second input and the first summing point. The BEMF extractor includes a high pass filter coupled to the second input and to an inductor amplifier. The BEMF extractor also includes a low pass filter coupled to the first summing point. The BEMF extractor includes a second summing point coupled to the low pass filter, the inductor amplifier, and the output.

20 Claims, 6 Drawing Sheets

SPEAKER ENHANCEMENT AND LINEARIZATION USING BEMF FEEDBACK

BACKGROUND

A speaker converts an electrical audio signal into sound. An alternating current electrical audio signal is applied to a coil of wire. The coil is suspended in a circular gap between the poles of a permanent magnet. Current flowing through the coil causes a magnetic field, and the coil moves rapidly back and forth due to the interaction of the magnetic field and the permanent magnet. This movement causes the speaker's cone attached to the coil to move back and forth, pushing on the air to create sound waves. As the cone moves in and out from its rest position, some parameters of the speaker change.

SUMMARY

In accordance with at least one example of the description, a system includes a feedforward path configured to provide an audio signal to a speaker. The system also includes a back electromotive force (BEMF) extractor coupled to the speaker. The BEMF extractor is configured to extract a sense voltage and a sense current at the speaker. The BEMF extractor is also configured to multiply the sense current by an impedance of the speaker to determine a voltage drop across the speaker impedance. The BEMF extractor is configured to subtract the voltage drop from the sense voltage to determine a BEMF. The system also includes a feedback loop configured to adjust the audio signal based at least in part on the BEMF.

In accordance with at least one example of the description, a system includes a feedforward path coupled to a signal input. The system also includes a speaker coupled to the feedforward path. The system includes a BEMF extractor coupled to the speaker, where the BEMF extractor has a first input, a second input, and an output. The BEMF extractor includes a first summing point coupled to the first input. The BEMF extractor includes a resistor amplifier coupled to the second input and the first summing point. The BEMF extractor includes a high pass filter coupled to the second input and to an inductor amplifier. The BEMF extractor also includes a low pass filter coupled to the first summing point. The BEMF extractor includes a second summing point coupled to the low pass filter, the inductor amplifier, and the output.

In accordance with at least one example of the description, a method includes providing an audio signal to a speaker. The method also includes sensing a sense current and a sense voltage at the speaker. The method includes multiplying the sense current by an impedance of the speaker to determine a voltage drop across the speaker impedance. The method also includes subtracting the voltage drop from the sense voltage to determine a BEMF. The method includes adjusting the audio signal based at least in part on the BEMF.

BRIEF DESCRIPTION OF THE DRAWINGS

The same reference numbers and/or other reference designators are used in the drawings to designate the same or similar (functionally and/or structurally) features.

DETAILED DESCRIPTION

Figure 1A:
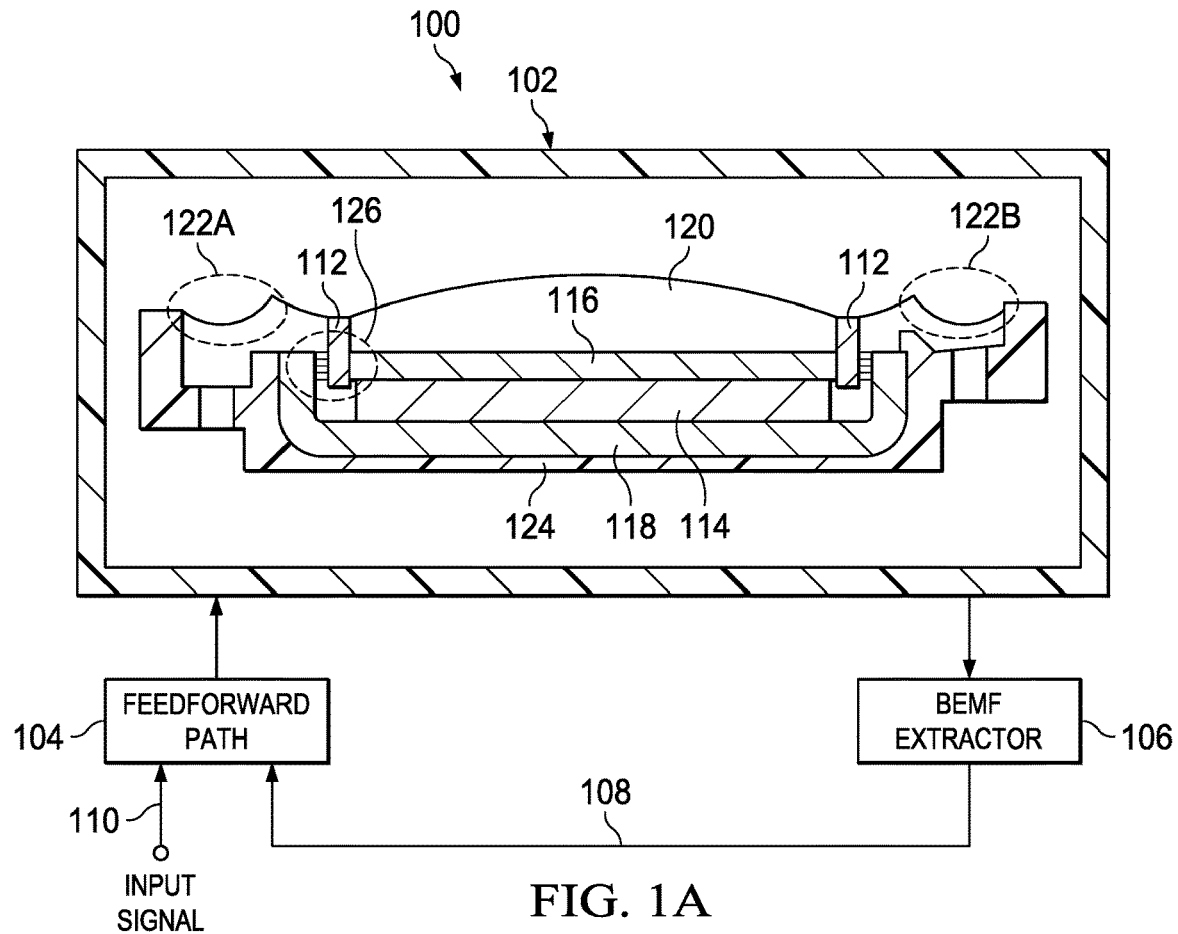
FIG. 1A is a diagram of a system for BEMF feedback in accordance with various examples.

The strength of the magnetic force produced by a speaker coil is proportional to the current and to the number of turns in the coil. The magnetic flux is denoted by B, and the number of turns is determined by the length L of the coil. Multiplication of the flux B and the length L of the conductor produces a parameter called the BL factor, which indicates how much magnetic force will be injected into the system as a function of the current. The BL factor changes as the cone moves in and out from its rest position. The distance that the cone travels from its resting position is known as excursion. The speaker also has a membrane that holds the cone in position. The membrane has some elasticity that helps to return the cone to its resting position. The elasticity of the membrane also changes as the membrane moves. Also, as the coil moves in the magnetic field, the inductance of the coil changes. Therefore, a speaker has non-linear parameters such as these that change with changes in the input audio signal. As the amplitude of the input signal increases, these non-linearities may cause distortion.

Alternative solutions have attempted to reduce the excursion of the cone and thereby reduce the changes in these non-linear parameters. One method includes reducing the input signal level at the resonant frequency to reduce the amount of excursion. However, this solution does not track changes in resonant frequency or the quality factor Q of the speaker, which is the factor that measures how underdamped a circuit is. If the alternative solution does attempt to track changes in resonant frequency and Q with an adaptation loop, the tracker is limited by the slow transient response of the adaptation loop. Another alternative solution uses an equalizer, but this solution just reduces the amplitude of the audio signal at certain frequencies. In another alternative solution, current is measured at the speaker and used in a feedback loop. However, the current increases with the size of the audio signal, which creates positive feedback in the feedback loop. Also, positive feedback shifts the poles in the low pass filters in the audio system, which compromises bandwidth.

In examples herein, BEMF is extracted and used in a feedback loop to reduce non-linearities in the speaker. BEMF is a voltage that is developed when a coil that conducts a current moves with respect to a magnetic field. BEMF has the opposite polarity of the drive voltage that drives the current in the coil. BEMF increases as the velocity of the speaker's cone increases. Therefore, BEMF is proportional to the movement of the cone, and BEMF tracks the movement of the cone in real time. This movement of the cone causes the non-linearities, so the BEMF also tracks the non-linearities. Because the BEMF changes in real time as the cone's velocity changes, BEMF does not incur the lag of an adaptation loop as described above. In examples herein, the BEMF may be extracted by measuring the current and voltage at the speaker using digital and/or analog circuitry. The BEMF is the drive voltage minus the voltage drop across the load (resistive plus inductive load) of the speaker. The extracted BEMF may be determined and then used as part of a feedback loop to track the movement of the speaker cone and compensate for that movement. Compensating for the speaker cone movement may reduce the effect of the non-linearities found in the speaker.

FIG. 1A is a diagram of a system 100 for BEMF feedback in accordance with various examples herein. System 100 includes a speaker 102, a feedforward path 104 (e.g., a front end), a BEMF extractor 106, a feedback loop 108, and an input 110. Speaker 102 includes coil 112, magnet 114, magnetic circuit components 116 and 118, cone 120, suspension 122A and 122B (collectively, suspension 122), frame 124, and magnetic field 126. In operation, magnet 114 and magnetic circuit components 116 and 118 create a magnetic field 126 that interacts with the coil 112. Cone 120 is coupled to coil 112 and to frame 124 via suspensions 122A and 122B. During operation of speaker 102, cone 120 has a displacement (in the vertical direction in this figure) due to the movement of coil 112 (caused by the changing current through the coil 112 based on changes of the input signal) and the flexibility of suspensions 122A and 122B. The displacement of cone 120 creates sound.

The feedforward path 104 receives an input signal at input 110. The input signal is an audio signal in one example. Feedforward path 104 may include digital and/or analog components such as amplifiers, filters, etc. Feedforward path 104 processes the input signal and provides the processed signal to speaker 102.

BEMF extractor 106 tracks the BEMF by measuring the voltage and current at the speaker 102. BEMF extractor 106 uses analog and/or digital circuitry to remove the drive voltage from the signal at the speaker, which is described below. The BEMF is left after the drive voltage is removed from the signal. Feedback loop 108 provides the BEMF to feedforward path 104, where BEMF is used as feedback for a control loop. The control loop generates a voltage that reduces the non-linearity in the speaker's output. The operation of BEMF extractor 106 is described below.

Figure 1B:
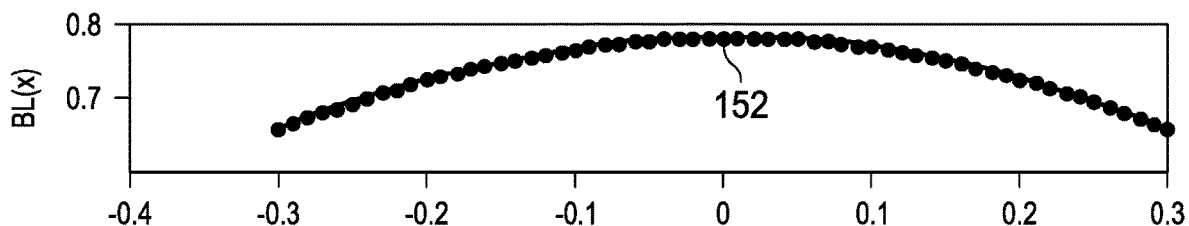
FIG. 1B is a collection of waveforms that describe non-linear parameters of a speaker in accordance with various examples.
Figure 1B:
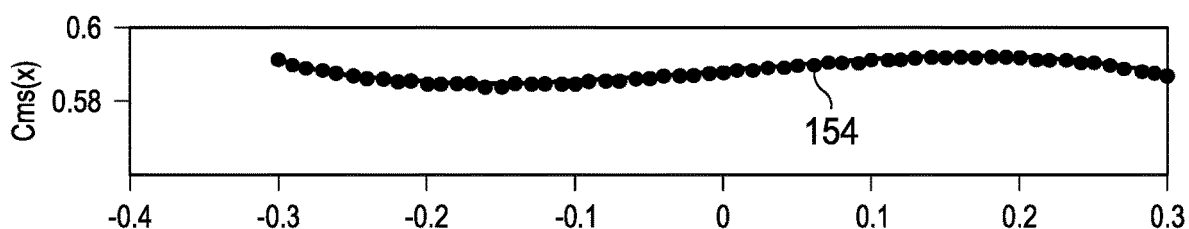
Figure 1B:
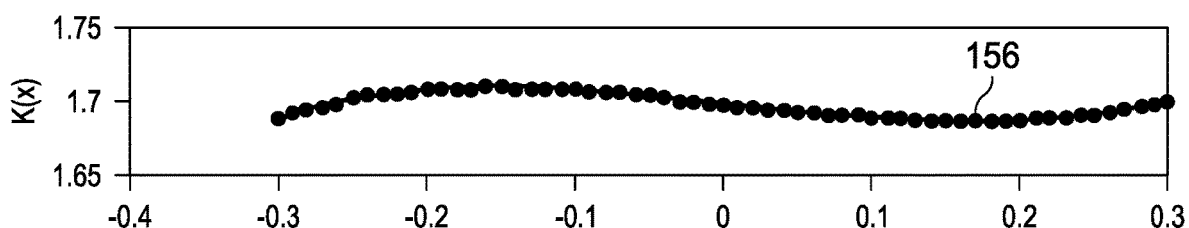
Figure 1B:
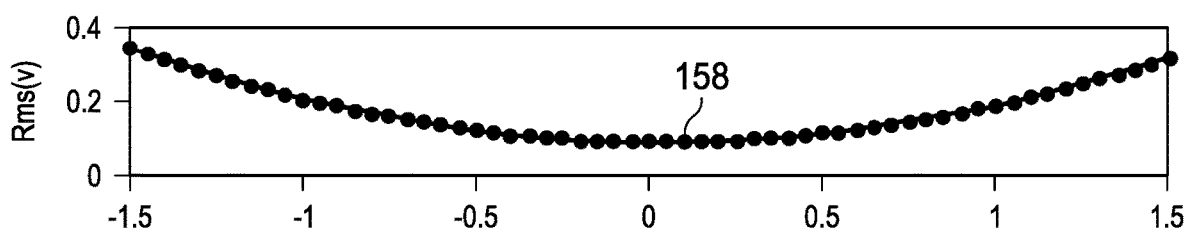
Figure 1B:
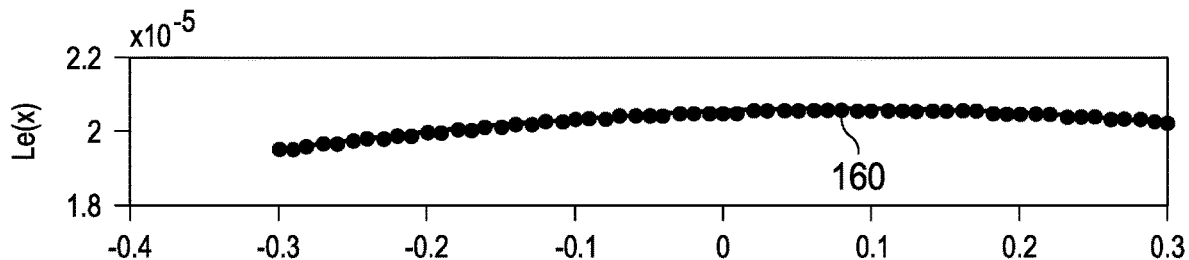

FIG. 1B is a collection of waveforms 150 that describe non-linear parameters of a speaker in accordance with various examples herein. The x-axes of the graphs represent the distance that the cone moves away from zero, or the cone's resting position. The y-axes of the graphs represent the change in the variable for each of the waveforms as the cone moves from its resting position. FIG. 1B includes waveforms 152, 154, 156, 158 and 160. Waveform 152 corresponds to the BL factor, and waveform 154 corresponds to the compliance of a membrane, such as suspensions 122. Waveform 156 is the spring constant K of the membrane, which is the inverse of the compliance. Waveform 158 represents the mechanical losses of the speaker. Waveform 160 represents the inductance of the coil 112.

Waveform 152 is the BL factor. The BL factor indicates how much magnetic force will be injected into the system as a function of the current. The maximum BL factor occurs where x=0, or near the cone's resting position. As the cone moves away from 0, in either direction, the BL factor decreases. Therefore, the BL factor is a non-linear parameter that changes as the cone moves away from its resting position. In ideal implementations, the BL factor would be mostly flat across the different positions of the cone.

Waveforms 154 and 156 are the inverses of one another. Waveform 154 represents the compliance of a membrane, while waveform 156 represents the spring constant K. The membrane holds the cone 120 in its position, and also pulls the cone 120 back to its resting position after the cone 120 moves. This behavior mimics the behavior of a spring, and is denoted as the spring constant K (waveform 156). As shown in waveforms 154 and 156, the spring constant K and the compliance vary as the position x of the cone 120 varies.

Waveform 158 represents the mechanical losses of the speaker. The mechanical losses may refer to the losses caused by the movement of the materials of the speaker, such as friction in the suspensions 122, and energy lost while pushing air to generate sound. Waveform 158 shows that the mechanical losses may also be non-linear and change with the position of the cone 120.

Waveform 160 shows the inductance L of the coil 112. The inductance L varies as the position of the cone 120 changes. The inductance L changes as the coil 112 moves away from the center of the magnetic field.

Speakers may have these non-linearities described above and other non-linearities. As the amplitude of the signal provided to the speaker 102 increases, distortion may occur. While the amplifier that provides the signal to the speaker 102 may operate linearly, the output of speaker 102 is not linear. In examples herein, distortion may be improved and the excursion of the cone 120 may be increased while maintaining acceptable or good sound quality. The examples herein may be useful in mobile applications (e.g., personal electronic devices, automobile sound systems, cell phones, tablets, computers or other systems where size and price constraints limit the quality of the speakers) where speakers are small and sound quality may be more difficult to achieve. Non-linearities may occur at lower sound levels with smaller speakers than with larger speakers. In examples herein, sound quality may be improved by improving linearity of these parameters or by increasing excursion of the cone 120 before distortion occurs.

A speaker may be considered to have three outputs: excursion (x), velocity (v), and acceleration (a). Velocity is the derivative of excursion, and acceleration is the derivative of velocity. If the excursion of a speaker is plotted with respect to frequency, the frequency response would resemble that of a low pass filter, with a peak at the resonant frequency. If the velocity of the speaker were plotted with respect to frequency, the frequency response of the velocity would resemble that of a bandpass filter. The resonant frequency of the velocity graph would depend on the mechanical properties of the system. If the acceleration were plotted with respect to frequency, the frequency response would resemble that of a high pass filter. A signal from an amplifier near the resonant frequency may generate high excursion and high acceleration. As excursion increases, the system may be more susceptible to the parameters that worsen with high excursion.

The perception of loudness obtained from a speaker may be referred to as sound pressure level (SPL), and is a function of acceleration. A higher SPL may generally be achieved at the resonant frequency. In some alternative examples, a higher SPL may not be needed at the resonant frequency, so excursion is reduced at the resonant frequency to create a flatter frequency response for the excursion. This alternative solution also flattens the acceleration curve. However, this alternative solution does not track the changes in the resonant frequency and the Q of the speaker. If an adaptive tracker is used in the alternative solution, the adaptive tracker is limited by the transient response of the adaptation loop.

In examples herein, BEMF is extracted from the driving voltage that drives the speaker. The BEMF may be extracted by measuring the current and voltage at the speaker using digital and/or analog circuitry. The BEMF is the drive voltage minus the voltage drop across the load (resistive plus inductive load) of the speaker. $I_{sense}$ is the sense current at the speaker, and $V_{sense}$ is the sense voltage at the speaker ($V_{sense}$ is the same as the drive voltage $V_{DRIVE}$). Equation (1) defines $I_{sense}$:

$$I_{sense}=(V_{sense}-\text{BEMF})/Z_{load} \tag{1}$$

where $Z_{load}$ is the impedance of the speaker. Equation (2) defines Load:

$$Z_{load}=Re+sLe \tag{2}$$

where Re is the resistive load and Le is the inductive load; s denotes differentiation in the Laplace domain for the inductive load. Substituting for $Z_{load}$ in Equation (1) results in Equation (3):

$$V_{sense}-\text{BEMF}=I_{sense}*(Re+sLe) \tag{3}$$

Solving for BEMF provides Equation (4):

$$\text{BEMF}=V_{sense}-Re*I_{sense}-s*Le*I_{sense} \tag{4}$$

Therefore, a BEMF extractor such as BEMF extractor 106 subtracts $Re*I_{sense}$ and $s*Le*I_{sense}$ from $V_{sense}$. The result is BEMF. The BEMF voltage is proportional to the speaker's velocity, and contains information regarding the speaker's non-linear behavior. In an example, BEMF may be used as feedback to a control loop that generates a driving voltage that reduces nonlinearity in the speaker's SPL.

Figure 2:
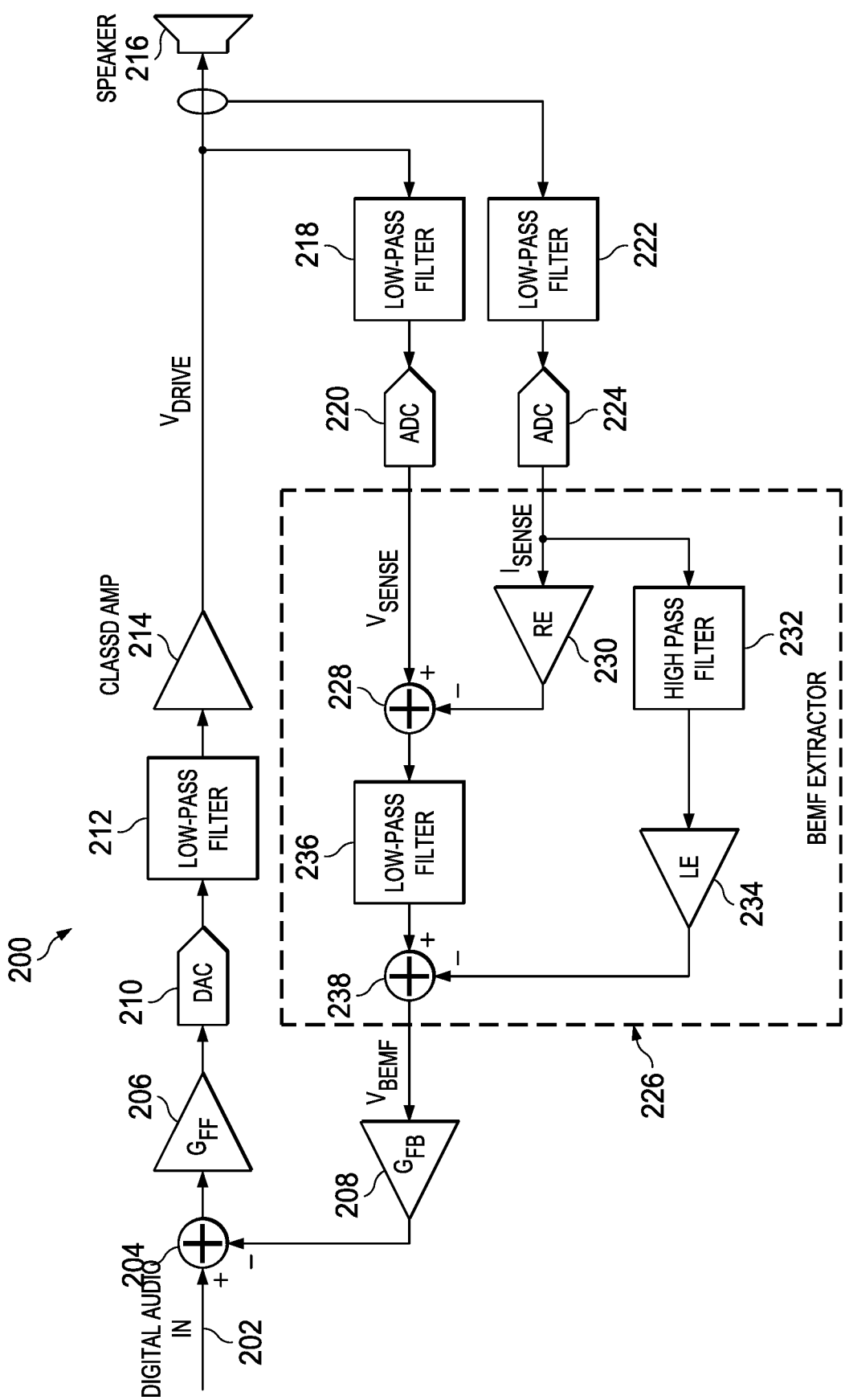
FIG. 2 is a block diagram of a system for speaker enhancement using BEMF extraction in accordance with various examples.

FIG. 2 is a block diagram of an example system 200 (an implementation of, for example, the speaker system of FIG. 1) for speaker enhancement using BEMF extraction in accordance with various examples herein. System 200 includes input 202, summing point 204, gain amplifiers 206 and 208, digital to analog converter (DAC) 210, low pass filter 212, amplifier 214, speaker 216, low pass filter 218, analog to digital converter (ADC) 220, low pass filter 222, ADC 224, and BEMF extractor 226. BEMF extractor 226 includes summing point 228, resistor amplifier 230, high pass filter 232, inductor amplifier 234, low pass filter 236, and summing point 238.

System 200 is a closed loop system in this example. Each of the components of system 200 may be either analog or digital components. In one example, low pass filter 212, amplifier 214, and low pass filters 218 and 222 may be an analog front end that perform harmonic suppression, amplification, and anti-aliasing of the signal. In other examples, other components may also be included in the analog front end.

In operation, a digital audio signal enters system 200 at input 202. The signal passes through gain amplifier 206, which may be a feed-forward amplifier in one example. The signal is then converted by DAC 210. Low pass filter 212 performs harmonic suppression of the signal. Amplifier 214 amplifies the signal, and may be a class D amplifier in one example. The signal output from amplifier is $V_{DRIVE}$, and this signal is provided to speaker 216 to produce sound.

The $V_{DRIVE}$ voltage is sensed at the speaker 216 and passed through low pass filter 218, and then to ADC 220. The output of ADC 220 is $V_{sense}$, which is provided to BEMF extractor 226 at a first input of the BEMF extractor 226 and then to summing point 228. The drive current is sensed at the speaker 216 and passed through low pass filter 222, and then to ADC 224. The output of ADC 224 is $I_{sense}$ (in some example embodiments, this signal may be a voltage representation of $I_{sense}$), which is provided to BEMF extractor 226 at a second input of the BEMF extractor 226. Pursuant to Equation (4) above, $I_{sense}$ is multiplied by Re (the resistive load of the speaker) at resistor amplifier 230, which is coupled to the second input of BEMF extractor 226. $I_{sense}$ is also passed through high pass filter 232 (coupled to the second input of BEMF extractor 226) and then multiplied by Le (the inductive load of the speaker) at inductor amplifier 234. The high pass filter operates as a differentiator for the current $I_{sense}$, so the derivative of the current $I_{sense}$ does not have to be calculated before multiplying by the inductive load Le. In one example, high pass filter 232 and low pass filter 236 have similar cutoff frequencies, such as cutoff frequencies within 10% of one another. In some examples, Re and/or Le may be tracked during operation of system 200. In other examples, pre-characterized values may be used to represent Re and/or Le.

The output of resistor amplifier 230 ($Re*I_{sense}$) is subtracted from $V_{sense}$ at summing point 228. The output of summing point 228 (e.g., $V_{sense}-Re*I_{sense}$) is provided to low pass filter 236. The output of low pass filter 236 is provided to summing point 238. At summing point 238, $Le*I_{sense}$ is subtracted from $V_{sense}-Re*I_{sense}$. Therefore, the output of summing point 238 is $V_{sense}-Re*I_{sense}-Le*I_{sense}$. As described above with Equation (4), $\text{BEMF}=V_{sense}-Re*I_{sense}-s*Le*I_{sense}$. Therefore, the output of summing point 238 is the BEMF, which is provided to an output of BEMF extractor 226 and then to gain amplifier 208.

BEMF extractor 226 may be composed of digital components in one example. In another example, BEMF extractor 226 may include analog components, or be composed entirely of analog components (whereby, in some examples, making it such that ADC's 220 and 224 are not necessary in the implementation of system 200). To reduce the noise in the system outside the bandwidth of interest, a low pass filter $H_{LPF}$ may be applied to BEMF. The application of the $H_{LPF}$ yields Equation 5):

$$\text{BEMF}=H_{LPF}*(V_{sense}-Re*I_{sense}-s*Le*I_{sense}) \tag{5}$$

Expanding Equation (5) yields Equation (6):

$$\text{BEMF}=H_{LPF}*(V_{sense}-Re*I_{sense})-S*H_{LPF}*Le*I_{sense} \tag{6}$$

In one example where $H_{LPF}$ is a first-order low pass filter, $s*H_{LPF}$ has the characteristics of a high-pass filter and may be denoted by $H_{HPF}$. Therefore, $H_{HPF}=s*H_{LPF}$. The updated BEMF equation is shown in Equation (7):

$$V_{BEMF}=H_{LPF}*(V_{sense}-Re*I_{sense})-H_{HPF}*Le*I_{sense} \tag{7}$$

where $H_{LPF}$ represents low pass filter 236 and $H_{HPF}$ represents high pass filter 232. The $V_{BEMF}$ equation is implemented by BEMF extractor 226. Low pass filter 236 and high pass filter 232 may be designed to have matching phase responses in one example. Low pass filter 236 and high pass filter 232 may also be independently designed in one example, instead of $H_{HPF}$ equaling $s*H_{LPF}$. The matching phase response may help for proper cancellation of the voltage drop across the coil of speaker 216 across the frequency range.

If filtering higher than first-order filtering is used in another example, additional low pass filter sections may be applied to the output of the BEMF extractor 226. Alternatively, these additional low pass filter sections may be included with both $H_{LPF}$ 236 and $H_{HPF}$ 232 in such a way that mathematically the filters 236 and 232 are approximately equivalent to the filtering created by applying the additional low pass filter sections to the output of BEMF extractor 226. In this example, the resulting filters are a low pass filter for filter 236 and a bandpass filter for filter 232.

The $V_{BEMF}$ (e.g., the BEMF) is provided by summing point 238 to gain amplifier 208. Gain amplifier 208 may be a feedback amplifier in one example. Gain amplifier 206 controls the open loop gain in an example, while gain amplifier 208 controls the closed loop gain in an example.

As described above, the BEMF is proportional to velocity. The velocity, when graphed with respect to frequency, may resemble the shape of a bandpass filter. Therefore, the cutoff frequency of low pass filter 236 should be lower than the center frequency of the bandpass filter, and the cutoff frequency of the high pass filter 232 should be higher than the center frequency of the bandpass filter, in one example.

In examples herein, BEMF is extracted from the signal at the speaker 216 via BEMF extractor 226 as described above. Then, a feedback loop uses BEMF to adjust the input signal via summing point 204 (e.g., a feedback summing point). By extracting BEMF, BEMF is not obscured by $V_{DRIVE}$ in a feedback loop, unlike alternative systems based on $I_{sense}$ feedback only. Also, BEMF based feedback does not have positive feedback on the feedback loop. Therefore, the loop gain may be increased above 0 decibel (dB) gain to obtain higher linearization performance. Additionally, the low pass filters in system 200 (212, 218, and 222) do not see their poles shifted to lower frequencies, which prevents bandwidth degradation of the system.

Because BEMF is proportional to the velocity of the cone of speaker 216, BEMF directly tracks the movement of the cone and its non-linearity in real time. Extracting BEMF via the examples herein may not have the lag of an adaptation loop found in alternative solutions. The closed loop systems in some examples also do not require assumptions about the system (e.g., for building a model), and may track any type of speaker behavior that is measured via the BEMF. In some examples, the frequency range where linearization is applied may be tuned. Additionally, the state variable that is being linearized may be changed. For example, acceleration may be linearized instead of velocity, as described below with respect to FIG. 5.

Figure 3:
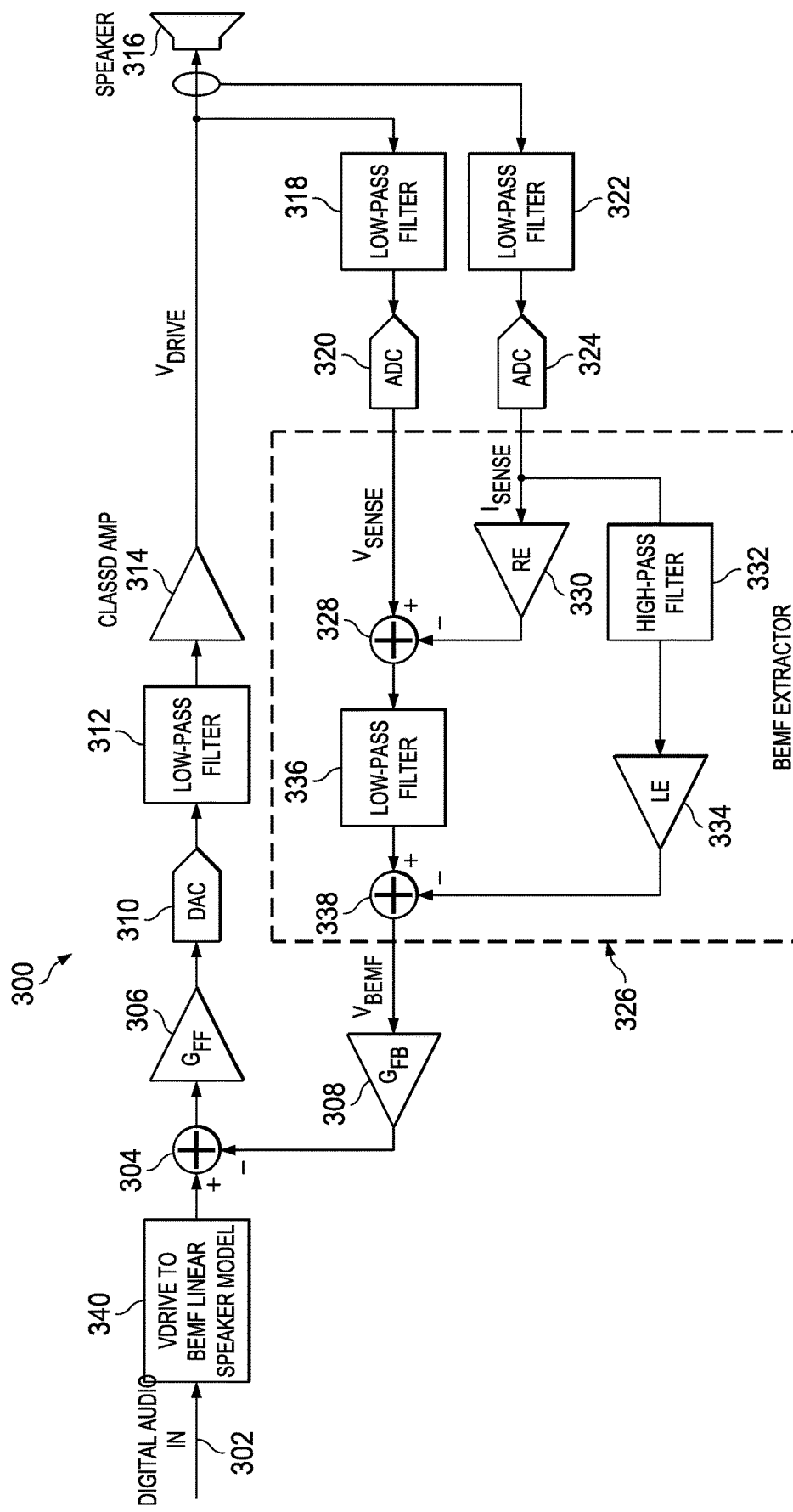
FIG. 3 is a block diagram of a system for speaker enhancement using BEMF extraction in accordance with various examples.

FIG. 3 is a block diagram of an example system 300 for speaker enhancement using BEMF extraction in accordance with various examples herein. The basic structure and operation of system 300 is similar to system 200 described above, and some like numbers (e.g., DACs 210 and 310, amplifiers 214 and 314, summing point 238 and 338, etc.) denote like components. System 300 includes input 302, summing point 304, gain amplifiers 306 and 308, DAC 310, low pass filter 312, amplifier 314, speaker 316, low pass filter 318, ADC 320, low pass filter 322, ADC 324, and BEMF extractor 326. BEMF extractor 326 includes summing point 328, resistor amplifier 330, high pass filter 332, inductor amplifier 334, low pass filter 336, and summing point 338. System 300 also includes speaker model 340. In this example, speaker model 340 is a Vdrive to BEMF linear speaker model.

System 300 operates similarly to system 200 as described above. System 300 extracts BEMF and uses BEMF in a feedback loop to reduce the non-linearity in the SPL of speaker 316. Also, in this example, speaker model 340 is placed in front of the closed-loop architecture. Speaker model 340 provides a reference BEMF that is tracked by the BEMF of speaker 316. Speaker model 340 may be a digital model in one example, or may be an analog model in other examples. The speaker model 340 may either be a fixed model (e.g., a model that is specific to the type of speaker used as speaker 316 and may be obtained based on specifications for the type of speaker and/or measured values for the speaker) or may be adaptively tracked using $V_{sense}$ and $I_{sense}$. The BEMF that is extracted by BEMF extractor 326 is compared to the BEMF provided by speaker model 340. Mathematical equations describe the speaker behavior based on the physics of the speaker, and speaker model 340 uses those equations to implement a transfer function. Using the feedback from BEMF extractor 326, system 300 attempts to match the ideal frequency response from speaker model 340.

Figure 4:
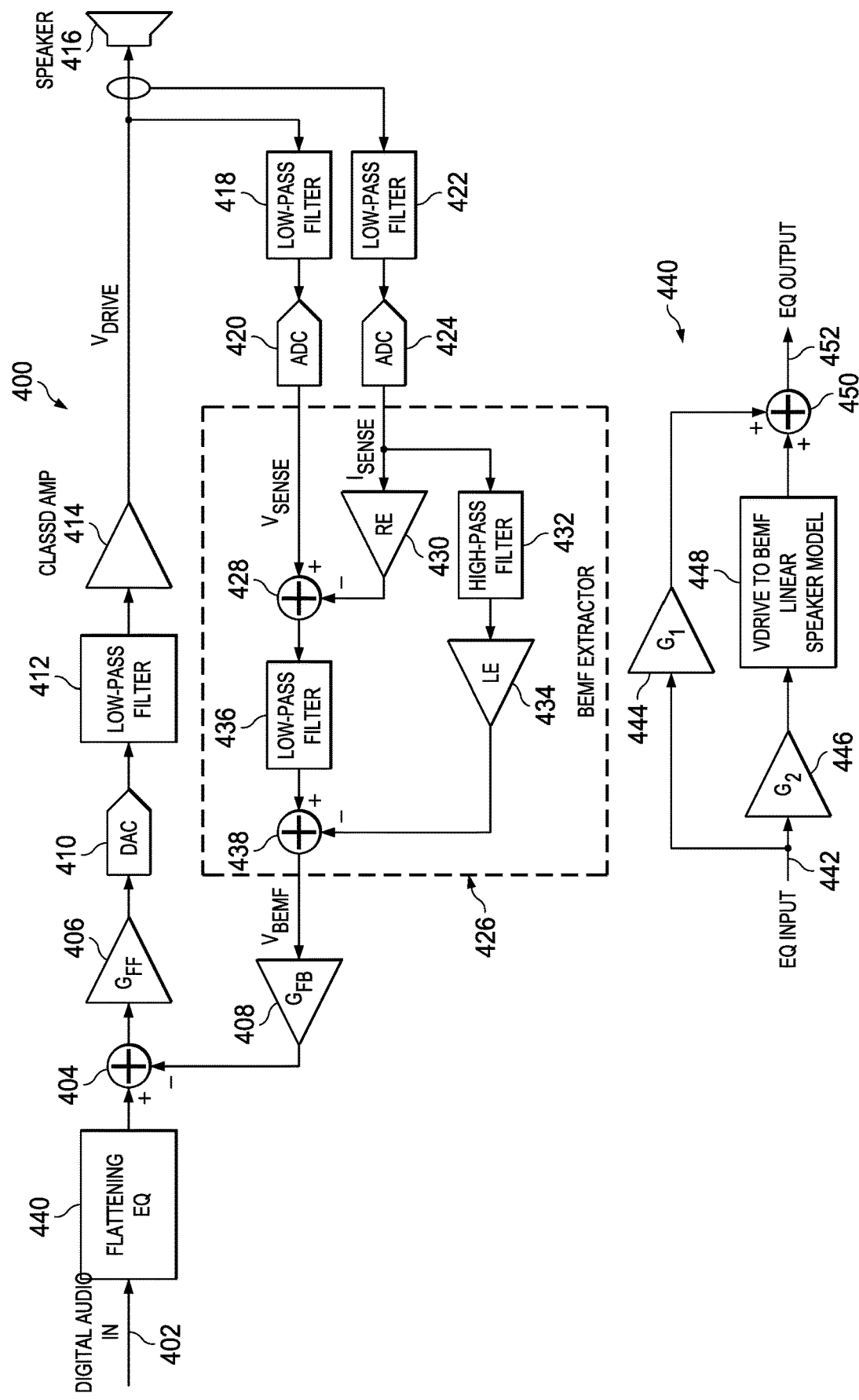
FIG. 4 is a block diagram of a system for speaker enhancement using BEMF extraction in accordance with various examples.

FIG. 4 is a block diagram of an example system 400 for speaker enhancement using BEMF extraction in accordance with various examples herein. The basic structure and operation of system 400 is similar to system 200 described above, and some like numbers denote like components (e.g., DACs 210 and 410, amplifiers 214 and 414, summing point 238 and 438, etc.). System 400 includes input 402, summing point 404, gain amplifiers 406 and 408, DAC 410, low pass filter 412, amplifier 414, speaker 416, low pass filter 418, ADC 420, low pass filter 422, ADC 424, and BEMF extractor 426. BEMF extractor 426 includes summing point 428, resistor amplifier 430, high pass filter 432, inductor amplifier 434, low pass filter 436, and summing point 438. System 400 also includes flattening equalizer (flattening EQ) 440. The bottom of FIG. 4 shows a sample circuit for flattening EQ 440. Flattening EQ 440 includes EQ input 442, gain amplifiers 444 and 446, speaker model 448, summing point 450, and EQ output 452.

System 400 operates similarly to system 200 as described above. System 400 extracts BEMF and uses BEMF in a feedback loop to reduce the non-linearity in the SPL of speaker 416. Also, in this example, flattening EQ 440 is placed in front of the closed-loop architecture. Flattening EQ 440 provides a flat frequency response of $V_{DRIVE}$ versus the digital audio input signal. In flattening EQ 440, the gain of amplifier 444 ($G_1$) is $1/(G_{FF}*ClassD\_Gain)$, where $G_{FF}$ is the gain of amplifier 406 and ClassD_Gain is the gain of amplifier 414. Also, the gain of amplifier 446 ($G_2$) is equal to $G_{FB}$ 408 in this example.

System 400 uses a speaker model 448 similar to speaker model 340 in FIG. 3. The speaker model 448 may either be a fixed model or may be adaptively tracked using $V_{sense}$ and $I_{sense}$. Speaker model 448 is embedded with two other gain amplifiers as well (444 and 446). The circuitry in system 400 that resides after flattening EQ 440 provides attenuation of signals at the resonant frequency. In some other cases, a flat frequency response may be desired from input 402 to the $V_{DRIVE}$ output of amplifier 414. Flattening EQ 440 may provide gain that compensates for the attenuation that the rest of the circuitry of system 400 provides. Therefore, the gain of flattening EQ 440 may cancel this attenuation at the resonant frequency.

Figure 5:
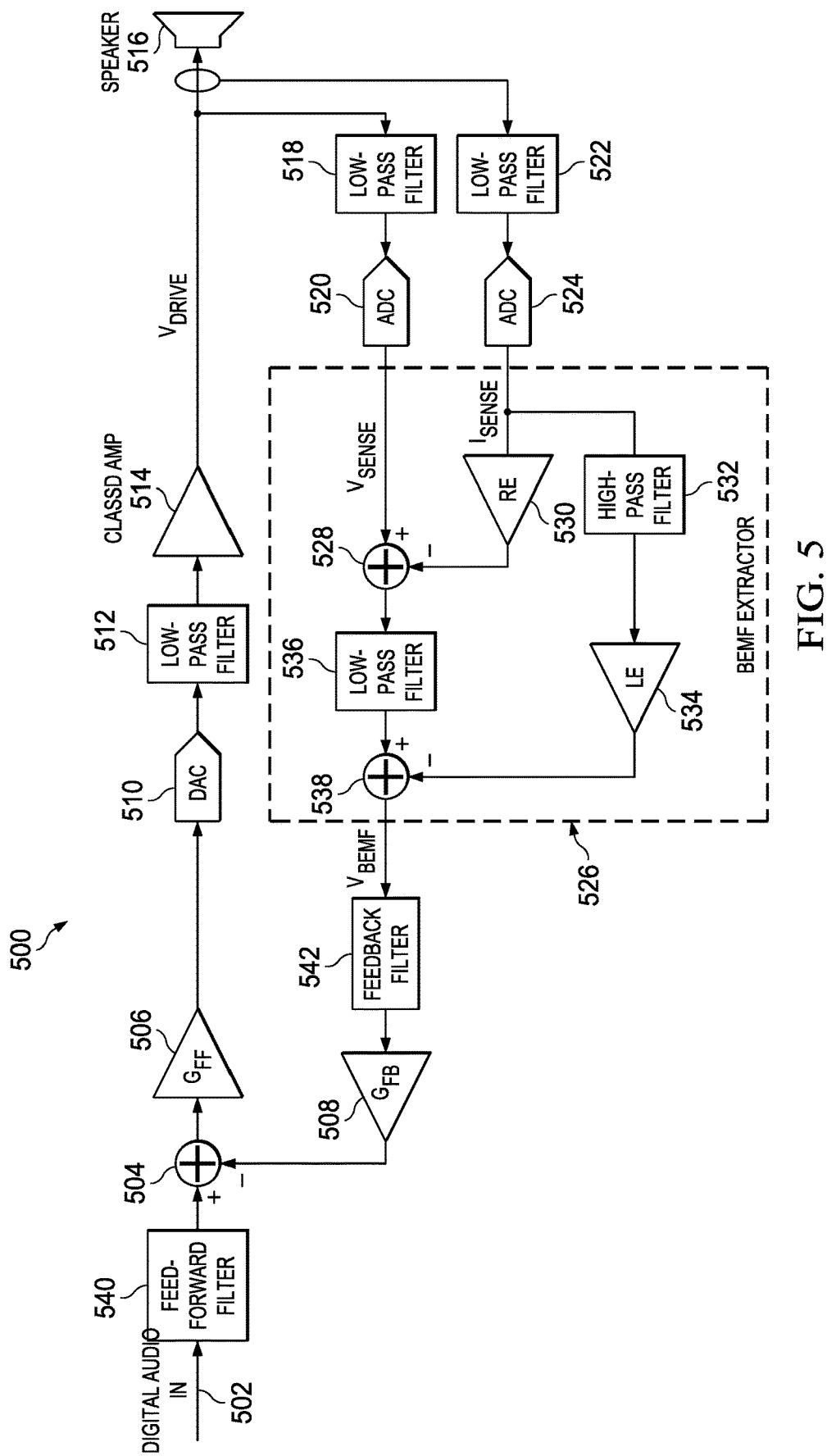
FIG. 5 is a block diagram of a system for speaker enhancement using BEMF extraction in accordance with various examples.

FIG. 5 is a block diagram of an example system 500 for speaker enhancement using BEMF extraction in accordance with various examples herein. The basic structure and operation of system 500 is similar to system 200 described above, and some like numbers denote like components (e.g., DACs 210 and 510, amplifiers 214 and 514, summing point 238 and 538, etc.). System 500 includes input 502, summing point 504, gain amplifiers 506 and 508, DAC 510, low pass filter 512, amplifier 514, speaker 516, low pass filter 518, ADC 520, low pass filter 522, ADC 524, and BEMF extractor 526. BEMF extractor 526 includes summing point 528, resistor amplifier 530, high pass filter 532, inductor amplifier 534, low pass filter 536, and summing point 538. System 500 also includes feed forward filter 540 and feedback filter 542.

System 500 operates similarly to system 200 as described above. System 500 extracts BEMF and uses BEMF in a feedback loop to reduce the non-linearity in the SPL of speaker 516. Also, in this example, additional filters 540 and 542 are added in the feed forward path and the feedback path, respectively. In one example, filters 540 and 542 alter the amount of linearization obtained at different frequency ranges. A user may want certain frequency ranges to be linearized more than other frequency ranges, and filters 540 and 542 may help to accomplish that goal. In another example, filters 540 and 542 convert the variable that is being linearized. In systems 200, 300, and 400, velocity is linearized, because the BEMF is linearized by those systems, and BEMF is proportional to velocity. However, a system with a feedback filter 542 that is a high pass filter that does not flatten until a very high frequency would translate BEMF (from BEMF extractor 526) to acceleration. As described above, acceleration is proportion to SPL. Therefore, with system 500, SPL may be linearized instead of velocity. Some, or all, of the components included in systems 200, 300, 400 and 500 may be used/not used in some example embodiments. Hence, some example embodiments, may include select components from system 300 and 500 without using the additional components from system 400.

Figure 6:
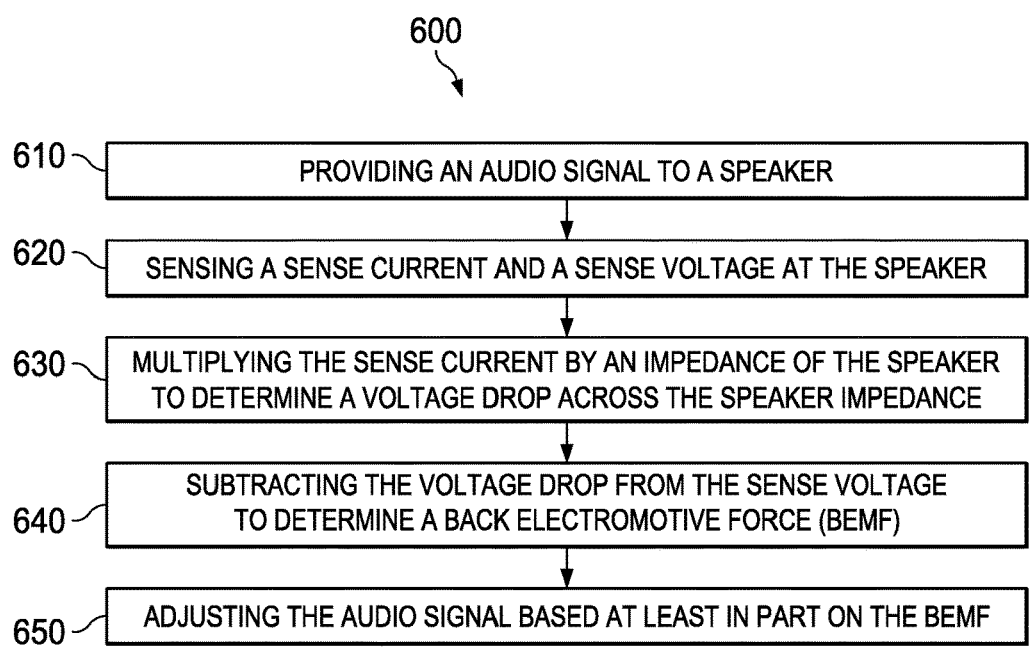
FIG. 6 is a flow diagram of a method for speaker enhancement using BEMF extraction in accordance with various examples.

FIG. 6 is a flow diagram of a method 600 for speaker enhancement using BEMF extraction in accordance with various examples herein. The steps of method 600 may be performed in any suitable order. The hardware components described above with respect to FIGS. 1A, 2, 3, 4, and 5 may perform method 600 in one example.

Method 600 begins at 610, where an audio signal is provided to a speaker. The audio signal may be a digital audio signal provided to an input such as input 202 in one example. The audio signal may pass through a feedforward path for processing before being provided to the speaker, such as speaker 216. In other examples, the audio signal may pass through other filters, speaker models, or equalizers before being provided to speaker 216.

Method 600 continues at 620, where a sense current and sense voltage are sensed at the speaker. Any suitable method, technique, or circuitry may be used to detect the sense voltage and sense current at the speaker. The sense voltage and sense current may then be filtered, passed through an ADC, and passed to a BEMF extractor, such as BEMF extractor 226.

Method 600 continues at 630, where the sense current is multiplied by an impedance of the speaker to determine a voltage drop across the speaker. The sense current may be multiplied by a resistance and an inductance of the speaker separately in one example. BEMF extractor 226 may perform this multiplication with digital circuitry in one example. In another example, analog circuitry may be useful. The sense current multiplied by the impedance of the speaker produces the voltage drop across the speaker impedance.

Method 600 continues at 640, where the voltage drop is subtracted from the sense voltage (sensed at the speaker) to determine a BEMF. BEMF extractor 226 may perform this subtraction with digital circuitry in one example, or with analog circuitry in another example. Equations (4) through (7) above show that this subtraction produces the BEMF.

Method 600 continues at 650, where the audio signal is adjusted based at least in part on the BEMF. The BEMF may be combined with the input audio signal as part of a feedback loop, and the BEMF reduces the non-linearity in the speaker's SPL. The BEMF is proportional to the speaker's cone velocity, and directly tracks the movement of the cone in real-time. Therefore, the BEMF may help to compensate for the non-linear speaker parameters such as the parameters described above.

By extracting BEMF using the systems described above, BEMF may be used as feedback to reduce the non-linearity in a speaker's SPL. Also, the examples herein do not have positive feedback on the feedback loop. Therefore, the loop gain may be increased above 0 dB gain to obtain higher linearization performance. BEMF directly tracks the movement of the cone and the cone's non-linearity in real time. Extracting BEMF via the examples herein may not have the lag of an adaptation loop found in alternative solutions. The closed loop systems in some examples described herein do not require assumptions about the system (e.g., for building a model), and may track any type of speaker behavior that is measured via the BEMF. In some examples, the frequency range where linearization is applied may be tuned. Additionally, the state variable that is being linearized may be changed.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistances, unless otherwise stated, are generally representative of any one or more elements coupled in series and/or parallel to provide an amount of impedance represented by the shown resistance. For example, a resistance shown and described herein as a single component may instead be multiple resistances coupled in parallel between the same nodes. For example, a resistance shown and described herein as a single component may instead be multiple resistances coupled in series between the same two nodes as the single resistance. Components illustrated as hardware components may, instead, be implemented as software that is stored in memory and executed using hardware (such as a processor, application specific integrated circuit, gate array, logic circuitry and/or a combination of the these). Furthermore, components described as analog or digital components may be implemented using digital and/or analog components, respectively.

Unless otherwise stated, "about," "approximately," or "substantially" preceding a value means +/−10 percent of the stated value. Modifications are possible in the described examples, and other examples are possible within the scope of the claims.

What is claimed is:

1. A system, comprising:
a feedforward path configured to provide an audio signal to a speaker;
a back electromotive force (BEMF) extractor configured to be coupled to the speaker, wherein the BEMF extractor is configured to:
extract a sense voltage and a sense current at the speaker;
multiply the sense current by an impedance of the speaker to determine a voltage drop across the speaker impedance; and
subtract the voltage drop from the sense voltage to determine a BEMF; and
a feedback loop configured to adjust the audio signal based at least in part on the BEMF.

2. The system of claim 1, wherein the impedance of the speaker includes a resistive load and an inductive load.

3. The system of claim 1, wherein the BEMF extractor includes a resistor amplifier configured to multiply the sense current by a resistance of the speaker.

4. The system of claim 1, wherein the BEMF extractor includes an inductor amplifier configured to multiply the sense current by an inductance of the speaker.

5. The system of claim 1, wherein the BEMF extractor includes a high pass filter and a low pass filter.

6. The system of claim 5, wherein the high pass filter and the low pass filter have cutoff frequencies within 10% of one another.

7. The system of claim 1, wherein the feedback loop has a gain greater than 0 decibels.

8. The system of claim 1, wherein the feedback loop has a gain of 0 decibels or less.

9. The system of claim 1, further comprising:
a speaker model configured to provide a reference BEMF to the feedback loop.

10. The system of claim 1, further comprising:
an equalizer coupled to the feedforward path and configured to provide a flat frequency response for the audio signal.

11. The system of claim 1, further comprising:
a feedback filter configured to convert the BEMF to a variable that represents a sound pressure level.

12. A system, comprising:
a feedforward path coupled to a signal input;
a speaker coupled to the feedforward path; and
a back electromotive force (BEMF) extractor coupled to the speaker, wherein the BEMF extractor has a first input, a second input, and an output, and the BEMF extractor includes:
a first summing point coupled to the first input;
a resistor amplifier coupled to the second input and the first summing point;
a high pass filter coupled to the second input and to an inductor amplifier;
a low pass filter coupled to the first summing point; and
a second summing point coupled to the low pass filter, the inductor amplifier, and the output.

13. The system of claim 12, further comprising:
a feedback amplifier coupled to the output of the BEMF extractor.

14. The system of claim 13, further comprising:
a feedback summing point coupled to the signal input and to the feedback amplifier.

15. The system of claim 14, further comprising:
a BEMF speaker model coupled between the signal input and the feedback summing point.

16. A method, comprising:
providing an audio signal to a speaker;
sensing a sense current and a sense voltage at the speaker;
multiplying the sense current by an impedance of the speaker to determine a voltage drop across the speaker impedance;
subtracting the voltage drop from the sense voltage to determine a back electromotive force (BEMF); and
adjusting the audio signal based at least in part on the BEMF.

17. The method of claim 16, wherein multiplying the sense current by the impedance of the speaker includes:
multiplying the sense current by a resistance of the speaker and multiplying a high-pass filtered version of the sense current by an inductance of the speaker.

18. The method of claim 16, further comprising:
providing the BEMF to a feedback amplifier.

19. The method of claim 16, further comprising:
adjusting the audio signal based at least in part on the BEMF and on a reference BEMF provided by a speaker model.

20. The method of claim 16, further comprising:
passing the audio signal through a flattening equalizer to produce the audio signal with a flat frequency response.

* * * * *